United States Patent [19]
Waldo

[11] Patent Number: 5,924,005
[45] Date of Patent: Jul. 13, 1999

[54] PROCESS FOR FORMING A SEMICONDUCTOR DEVICE

[75] Inventor: Whit G. Waldo, Hutto, Tex.

[73] Assignee: Motorola, Inc., Schaumburg, Ill.

[21] Appl. No.: 08/801,328

[22] Filed: Feb. 18, 1997

[51] Int. Cl.⁶ .................................. H01L 21/312
[52] U.S. Cl. ................. 438/623; 438/780; 438/781
[58] Field of Search ..................... 438/623, 780, 438/781

[56] References Cited

U.S. PATENT DOCUMENTS

| | | | |
|---|---|---|---|
| 4,423,547 | 1/1984 | Farrar et al. | 29/571 |
| 4,430,153 | 2/1984 | Gleason et al. | 156/643 |
| 4,751,171 | 6/1988 | Ogawa | 430/299 |
| 5,270,259 | 12/1993 | Ito et al. | 437/235 |
| 5,284,801 | 2/1994 | Page et al. | 437/195 |
| 5,310,720 | 5/1994 | Shin et al. | 437/231 |
| 5,358,739 | 10/1994 | Baney et al. | 427/226 |
| 5,508,144 | 4/1996 | Katz et al. | 430/296 |
| 5,635,428 | 6/1997 | Martin et al. | 438/623 |
| 5,756,256 | 5/1998 | Nakato et al. | 430/272.1 |

OTHER PUBLICATIONS

Baik, Ki–Ho, et al. "Liquid phase silylation for the DESIRE process", SPIE vol. 1672 Advanced in Resist Technology and Processing IX, vol. 1672, pp. 362–375. Note that this paper was sent in by applicant for consideration, Mar. 1992..

*Primary Examiner*—Tuan H. Nguyen
*Assistant Examiner*—Matthew Whipple

[57] ABSTRACT

A low dielectric constant (k) polymer is used for an interlayer dielectric (28) of a semiconductor device (20). Unlike prior art low k polymer materials, a photoresist layer can be deposted directly on interlayer dielectric (28) due to the presence of an in-situ glass layer (32) formed within the interlayer dielectric. Glass layer (32) is formed by silylating the upper surface of the polymer material and then oxygenating the upper surface, for example in a plasma environment in an oxygen atmosphere. Silylation can occur, for example, by implantation, vapor phase diffusion, or liquid phase diffusion of silicon into the upper surface of the polymer. The silylation and oxygenation processes are performed at low temperature and are thus compatible with use of organic polymer films.

19 Claims, 2 Drawing Sheets

PROCESS FOR FORMING A SEMICONDUCTOR DEVICE

FIELD OF THE INVENTION

The present invention relates to semiconductor manufacturing processes in general, and more particularly to processes which utilize low dielectric constant materials.

BACKGROUND OF THE INVENTION

As semiconductor manufacturers continually try to reduce the feature size of semiconductor devices, line-to-line capacitance becomes a problem. When metal lines of a semiconductor device are patterned closer and closer together, the dielectric constant (k) of any interlayer dielectric used needs to be reduced in order to prevent the capacitance between those lines from increasing. Conventional interlayer dielectrics (ILDs) in the form of chemical vapor deposition (CVD) oxide, such as that deposited from tetraethylorthosilicate (TEOS), have k values of approximately 3.9 to 4.1. For future generation devices, for instance devices with minimum feature sizes at or below 0.25 micron, it is believed that these dielectric films will produce unacceptable line-to-line capacitance and that lower k dielectric films will be needed.

One attempt to reduce the dielectric constant of an interlayer oxide is to fluorinate the oxide during deposition. However, the resulting reduction in the dielectric constant is of insufficient magnitude to result in a dramatic difference in line-to-line capacitance. For example, fluorinated oxides have a k value of between 3.4 and 3.6. Other materials have been able achieve a k value of about 3.0, for example silsesquioxanes. Polyimides are another material being evaluated for low k applications. Polyimides typically have k values between 3.2 and 3.3 Some polymers have been introduced which result in k values of even less than 3, for example Cyclotene 5021 by Lucent Technologies and Parylene VIP AF-4 by Specialty Coating Systems.

Despite the fact that low k polymers exist, few have achieved success in use in semiconductor manufacturing for a variety of reasons. One problem is that photoresist cannot be deposited directly on the polymer to pattern vias in the polymer. Photoresist can be either miscible or partially miscible with the underlying polymer. The former causes the photoresist to solubilize the polymer ILD. The latter would create an interfacial layer between the photoresist and interlayer dielectric which could adversely effect patterning or removal of the photoresist layer. A proposed solution to this problem is to deposit an oxide or spin-on-glass (SOG) layer as a hard mask on top of the polymeric interlayer dielectric prior to the deposition of photoresist. However, the problem with using an oxide, such as by chemical vapor deposition (CVD), is that it is deposited at a high temperature which can be harmful to the underlying polymer. Exposing the polymer interlayer dielectric to high temperatures during oxide deposition can adversely affect its dielectric constant (by raising it) and cause the polymer layer to flow. While SOGs can be deposited at low temperatures, the use of SOGs impose particulate problems in manufacturing and either must be removed or capped with a subsequent layer, thus introducing additional processing steps.

Accordingly, there is a need in the art of semiconductor manufacturing to be able to deposit a low k dielectric film in a semiconductor device to reduce line-to-line capacitance, while at the same time overcoming the miscibility and high temperature incompatibility problems associated with prior art low k dielectric materials.

DETAILED DESCRIPTION OF A PREFERRED EMBODIMENT

Figure 1:
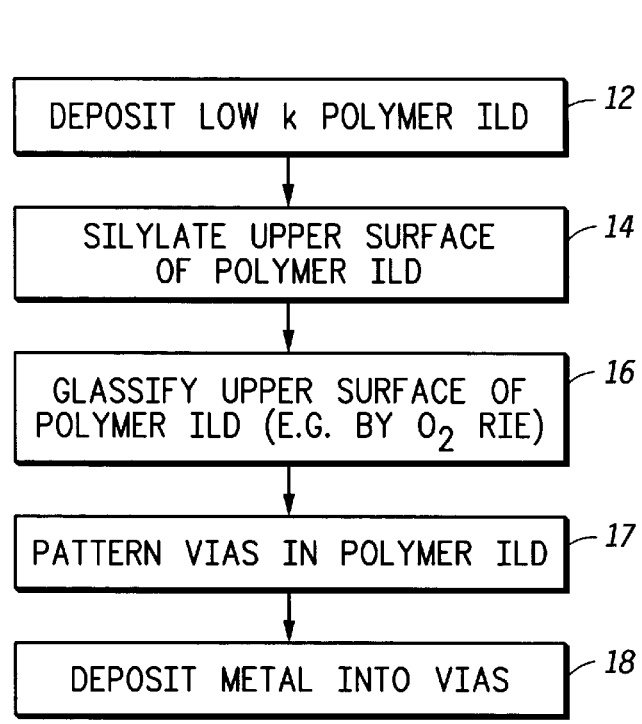
FIG. 1 illustrates in flow diagram form a process for depositing a low k polymer interlayer dielectric in accordance with one embodiment of the present invention.

Generally, the present invention is a process for fabricating a semiconductor device using a low k polymer material as an interlayer dielectric (ILD). Unlike processes of the prior art, the present invention utilizes a top surface glassification process that transforms the upper most layer (e.g. the top 0.1 microns) of the polymer interlayer dielectric into a glass layer, thereby enabling photoresist materials to be deposited directly on the polymer interlayer dielectric without unwanted interaction. In one form of the invention, glassification is achieved by silylating the top surface of the polymer and then oxygenating the silylated surface to form $SiO_2$. The glassification process used in accordance with the present invention can be accomplished using existing manufacturing equipment, is a low defectivity process (being diffusion based instead of deposition based), and is achieved at temperatures compatible with organic low k polymer films.

These and other features and advantages of the present invention will be better understood in view of the following description taken in conjunction with FIGS. 1 through 6. It is important to realize that while one particular embodiment of the invention is described, there are likely to be other embodiments that fall within the scope of the invention. It is also noted that the drawings are not necessarily drawn to scale, and that where appropriate the same or similar reference numerals are used to denote identical or corresponding elements throughout the various views.

Figure 2:
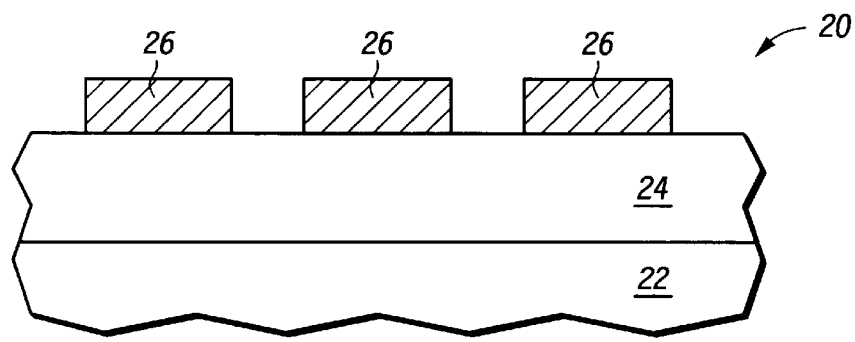
FIGS. 2 through 6 illustrate, in partial cross-sectional views the steps of the process of FIG. 1 as carried out sequentially on a semiconductor substrate in accordance with the invention.

FIG. 1 illustrates a process 10 for making a semiconductor device having a low k polymer interlayer dielectric in accordance with one embodiment of the present invention. The various steps of process 10 may be better understood in reference to the cross-sectional figures in FIGS. 2–6, which illustrate a portion of a semiconductor device as the steps of process 10 are performed. In a first step 12, a low k polymer interlayer dielectric (ILD) is deposited over a semiconductor device substrate. FIG. 2 illustrates a portion of a semiconductor device 20 on which such a low k polymer ILD is to be deposited. Semiconductor device 20 includes a substrate 22, a first interlayer dielectric 24, and a plurality of metal lines 26.

While process 10 is hereinafter described in reference to forming an interlayer dielectric material between a first and a second metal layer of a semiconductor device, it is important to realize that an interlayer dielectric formed in accordance with present invention can be formed at any point in the manufacturing process where such a dielectric layer is needed. For example, the present invention can be used to form a dielectric layer over polysilicon or single crystal silicon rather than over a metal layer. Accordingly, device 20 illustrated in FIG. 2 is represented rather generically. If forming a low k polymer dielectric in accordance with the present invention between a first and a second metal layer, substrate 22 will be made up of a variety of underlying layers and elements which are not specifically illustrated. For example, substrate 22 will likely include a single crystalline semiconductor material such as silicon, field or trench isolation regions, polysilicon members such as gate electrodes, diffused or implanted source and drain regions, gate oxide, sidewall spacers, conductive plugs, and the like. None of these underlying structures are particularly relevant to understanding or appreciating the present invention and thus are not described or illustrated in detail.

In an instance where an interlayer dielectric is utilized between adjacent metal layers, a plurality of metal lines 26 are likely to exist somewhere over the substrate. These members will be electrically isolated from underlying members of the device by a first interlayer dielectric 24, except where they are intentionally connected. It is noted that interlayer dielectric 24 can also be formed in accordance with the process hereinafter described for glassifying the ILD in accordance with the present invention. Metal lines 26 can be formed of any of the metals commonly used in semiconductor manufacturing including aluminum and aluminum alloyed with small amounts of silicon and/or copper. Other metals including copper can also be used. Further, the lines can be conductive members of polysilicon.

Figure 3:
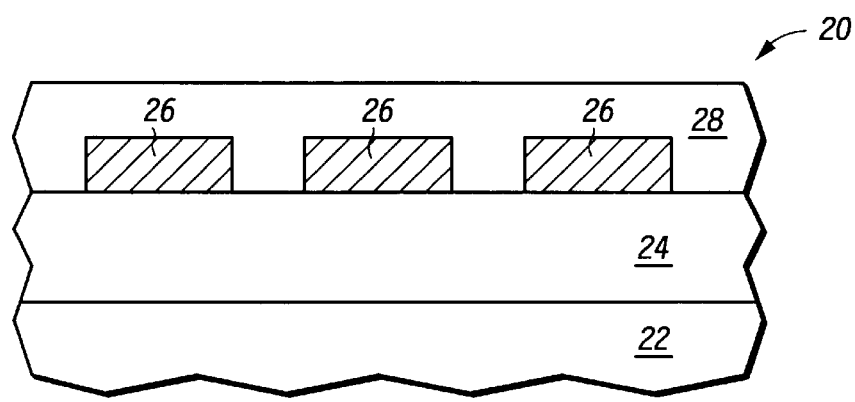

After metal members 26 are formed using conventional methods, a low k polymer ILD 28 is deposited over the semiconductor device, as shown in FIG. 3. In preferred embodiments in the present invention, polymer ILD has a dielectric constant less than or equal to 3.5, and more preferably less than or equal to 3.0. As shown in FIG. 3, polymer ILD 28 fills the space between conductive metal lines 26, and will therefore serve a capacitor dielectric between adjacent metal lines. To reduce this capacitance, it is preferred that the dielectric constant of polymer ILD be as close to ideal (k =1) as possible. Suitable low k materials for polymer ILD 28 include Cyclotene 5021 by Lucent Technologies and Parylene VIP AF-4 by Specialty Coating Systems.

Figure 4:
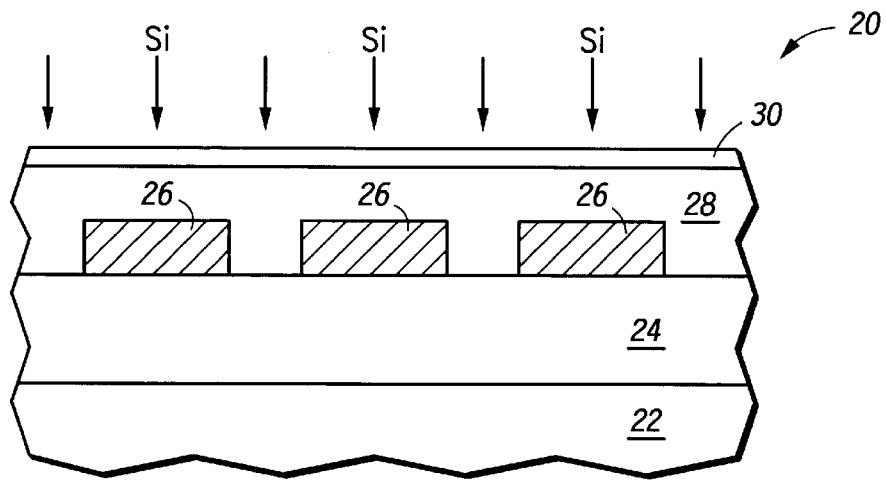

After depositing polymer ILD 28, the upper surface of the polymer layer is silylated in accordance with step 14 of process 10 and as represented in FIG. 4. Silylation is the process of introducing silicon into the upper surface of the polymer film. Silylation can occur by either chemical or physical means. In a chemical reaction, liquid phase or vapor phase diffusion of silicon occurs in a reaction chamber, causing the hydrogen of hydroxyl groups present on the upper surface of the polymer to be replaced with an organo-silicon chain. An example of such a chemical reaction is the introduction of hexamethyldisilazane (HMDS) over a polymer layer on the substrate to form a silyl ether. A physical silylation process involves the implantation of silicon atoms into the upper surface of the polymer ILD layer. The resulting silylated layer is illustrated in FIG. 4 as layer 30. Preferably the silylation occurs within the top 0.1 μm of the polymer ILD.

With respect to the silylation process, there are several chemical procedures for effecting silylation. One method introduces a photoactive compound as a photoacid generator which is unbounded to the polymeric resin backbone. One example of such a photoactive compound, or PAC, is diazoketone. The configuration of diazaoketone is given below.

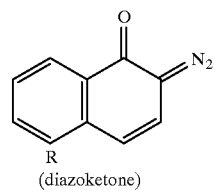

(diazoketone)

Another such photoactive compound is a diazidudiphenyl derivative (4, 4'), and its configuration is given as:

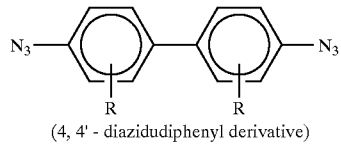

(4, 4' - diazidudiphenyl derivative)

where the notation includes bonding of each R to any of the corners of the benzene ring.

Referring to the diazoketone, illustrated above, carboxylic acid is formed after exposure to actinic radiation in the presence of trace water. The result is given as:

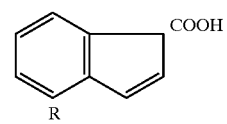

which after silylation becomes:

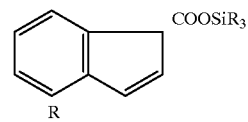

Alternatively, for polymer design and fabrication, the resin or PAC is modified through chemical reaction to replace the hydrogen in the hydroxy radical of a phenyl compound with a silylated radical. Note that either the resin manufacturer or the user could perform the silylation. Also, the resin could be modified to create a phenylic group or to modify an existing phenolic group to be a phenyl alcohol or any other protic site (e.g. —OH, NH, SH, COOH). There are various other processes which exist, and are well known to one skilled in the art of polymer chemistry. An exhaustive discussion of these various methods is not necessary to fully describe the present invention. According to one embodiment of the present invention, the phenyl compound group is converted through silylation into an aryl-silyl ether. The aryl-silyl ether is given below.

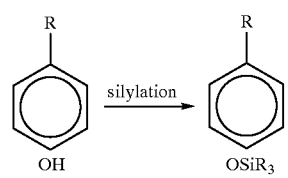

According to another embodiment of the present invention, the PAC is kept as a separate unbounded molecule that is mixed into the polymer solution. There are a variety of solvents that solubilize PACs and diazonapthaquinones (DNQs), which are a type of PACs, as well most polymers. (Diazonapthquinone (DNQ), a type of diazoketone, is commercially available and widely used in many common photoresists.) Some applicable solvents used in semiconductor manufacturing include propylene glycol monomethyl ether acetate (PGMEA), cellusolve acetate, ethyl alcohol, 1-methyl-2 pyrrolidone, acetone, etc. According to this silylation approach, the PAC (e.g. DNQ) adds cost to the product by adding a separate, additional component. Note that this discussion is not to be considered exhaustive, but is rather given as a brief explanation of the silylation process.

Figure 5:
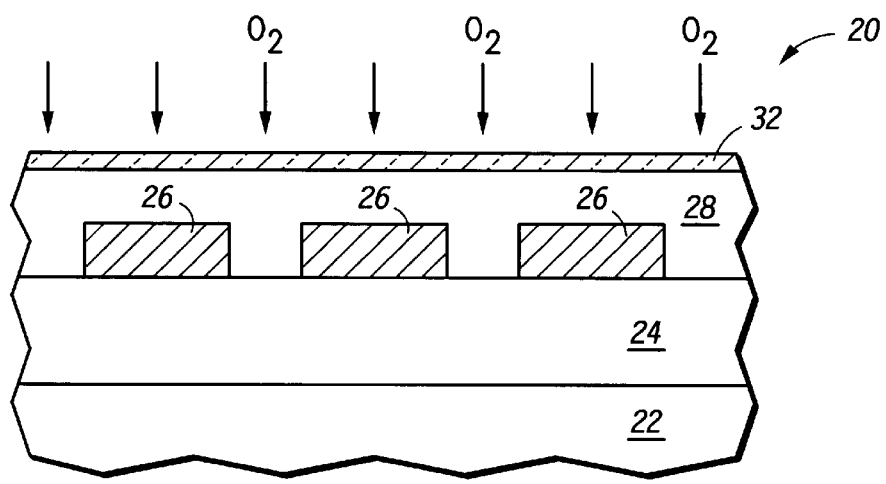
Figure 6:
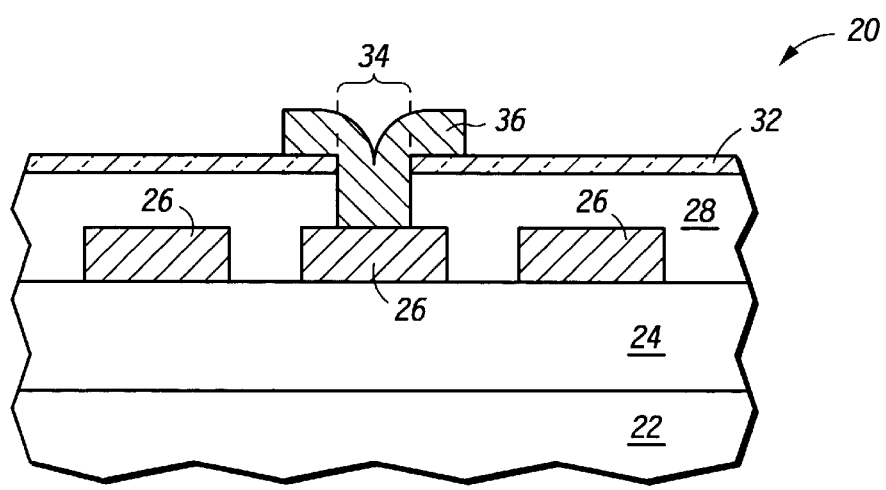

After introducing silicon into the upper surface of the polymer ILD, the silicon is reacted with oxygen to form an in-situ glass layer 32 within the polymer ILD as shown in FIG. 5. In process 10, this process is represented by step 16 which is a glassification of the polymer ILD. One method for glassifying the silicon is to oxygenate the silicon in a plasma environment, for example in a reactive ion etcher in a plasma environment (but without etching away the ILD). Other methods for glassifying the upper surface of the polymer ILD are also conceivable, but it is important that any method employed be compatible with the glass transition temperature of the polymer ILD (i.e. be performed below the glass transition temperature). Processes which result in glassification above this temperature are likely to degrade the physical properties of the polymer ILD rendering it less effective. According to one embodiment of the present invention, the glass layer formed within the ILD material is graded such that the concentration of $SiO_2$ increases toward the top surface of the ILD and decreases toward the substrate.

After glassifying the upper surface of the polymer ILD, fabrication of the semiconductor device continues in accordance with the conventional practice. For example, a via opening 34 can be formed in the polymer ILD to enable contact to be made to one of the metal lines 26 by a metal contact 36. In forming via opening 34, a photoresist layer is deposited over device 20, wherein the photoresist is in direct contact with glass layer 32. Because the photoresist is in contact with glass layer 32 rather than the bulk polymer material ILD 28, the miscibility problems previously discussed in association with prior art techniques are avoided in practicing the present invention. The photoresist layer can then be patterned and the via etched in accordance with conventional practices, without adverse effects on low k polymer ILD 28.

The foregoing description demonstrates many of the advantages of practicing the present invention. The present invention enables the use of low k polymer materials for ILDs, thereby reducing capacitive coupling between adjacent metal lines in fine-featured semiconductor devices. An in-situ glass layer is created within a low k polymer, rather than depositing a separate oxide film on the polymer. Accordingly, the polymer does not experience the high temperatures often used during oxide depositions. With the in-situ glass layer, photoresist can be deposited directly on the polymer ILD (in contact with the in-situ glass layer), without solubilizing the polymer. Another advantage of the present invention is that the in-situ glass layer can be formed using manufacturing equipment already in use, such a reactive ion etchers (with an oxygen source) and/or implanters, so that additional capital outlay is minimal. A further advantage of practicing the present invention is that the entire process is a diffusion oriented process, rather than being a deposition based process, thereby reducing the possibility of particulate generation. Moreover, the present invention can be practiced with a minimal glass layer thickness (e.g. less than 0.1 μm) so that processing time to form the glass layer is kept minimal.

Thus it is apparent that there has been provided, in accordance with the invention, a process for forming a low k polymer interlayer dielectric in a semiconductor device. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the present invention is not limited to a particular glass layer thickness, although thinner layers will enable higher throughput. Furthermore, the present invention is not limited to the particular method(s) in which silicon is introduced into the polymer layer. As an example, silicon can be incorporated into the polymer layer prior to deposition onto the substrate (e.g. a pre-silylated polymer precursor). Nor is the invention limited to a particular method for transforming or converting the silicon into $SiO_2$. Therefore, it is intended that this invention encompass all such variations and modifications as fall within the scope of the appended claims.

I claim:

1. A process for forming a semiconductor device comprising the steps of:

providing a substrate;

depositing a polymer over the substrate to form an interlayer dielectric, the polymer having a dielectric constant less than 3.5, the interlayer dielectric having a top surface;

forming a silylated layer within the interlayer dielectric by introducing silicon into the polymer after depositing the polymer; and transforming the silylated layer into a glass layer prior to forming any resist layer over the silylated layer.

2. The process of claim 1, further comprising the steps of:

after the step of transforming the silylated layer patterning a via in the interlayer dielectric; and depositing a conductive material into the via.

3. The process of claim 1, wherein the step of transforming the silylated layer into a glass layer results in a glass layer thickness of at most 0.1 micron.

4. The process of claim 1 wherein the step of forming the silylated layer comprises the step of:

introducing silicon atoms into the top surface of the interlayer dielectric by ion implantation.

5. The process of claim 1 wherein the step of forming the silylated layer comprises the step of:

introducing silicon atoms into the top surface of the interlayer dielectric by vapor phase diffusion.

6. The process of claim 1 wherein the step of forming the silylated layer comprises the step of:

introducing silicon atoms into the top surface of interlayer dielectric by liquid phase diffusion.

7. The process of claim 1 wherein the step of transforming the silylated layer into a glass layer comprises the step of:

oxygenating the silylated layer.

8. The process of claim 1 wherein the polymer has a glass transition temperature, and wherein the step of transforming the silylated layer is performed at a temperature below the glass transition temperature of the polymer.

9. A process for forming a semiconductor device comprising the steps of providing a substrate;

depositing a polymer over the substrate to form an interlayer dielectric film, the interlayer dielectric film having a top surface;

introducing silicon into the polymer after depositing the polymer;

transforming the silicon at the top surface of the interlayer dielectric film into a glass layer prior to forming any resist layer over the interlayer dielectric film; and forming a conductive layer over the glass layer.

10. The process of claim 9 wherein the interlayer dielectric film is a polymer having a dielectric constant of at most 3.5.

11. The process of claim 9 wherein the step of depositing a polymer comprises the step of:

silylating the polymer to form silicon near the top surface.

12. The process of claim 11 wherein the step of silylating the polymer comprises the step of:

introducing silicon atoms into the top surface of the interlayer dielectric film by ion implantation.

13. The process of claim 11 wherein the step of silylating the polymer comprises the step of:

introducing silicon atoms into the top surface of the interlayer dielectric film by vapor phase diffusion.

14. The process of claim 11 wherein the step of silylating the polymer comprises the step of:

introducing silicon atoms into the top surface of the interlayer dielectric film by liquid phase diffusion.

15. The process of claim 9 wherein the step of oxygenation of the silicon is performed in a plasma environment.

16. The process of claim 15 wherein the plasma environment is in a reactive ion etch system.

17. The process of claim 9 wherein the polymer has a glass transition temperature, and wherein the step of transforming the silicon is performed at a temperature below the glass transition temperature of the polymer.

18. The process of claim 1, further comprising:

forming a resist layer overlying the glass layer;

patterning the resist layer to expose a surface portion of the glass layer; and forming an opening through exposed surface portions of the glass layer.

19. The process of claim 9, further comprising:

forming a resist layer overlying the glass layer;

patterning the resist layer to expose a surface portion of the glass layer; and forming an opening through exposed surface portions of the glass layer prior to forming a conductive layer over the glass layer.

* * * * *